(12) United States Patent
Suen et al.

(10) Patent No.: US 9,780,251 B2
(45) Date of Patent: Oct. 3, 2017

(54) SEMICONDUCTOR STRUCTURE AND MANUFACTURING METHOD THEREOF

(71) Applicant: XINTEC INC., Taoyuan (TW)

(72) Inventors: Wei-Luen Suen, New Taipei (TW); Wei-Ming Chien, Taoyuan (TW); Po-Han Lee, Taipei (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/451,202

(22) Filed: Mar. 6, 2017

(65) Prior Publication Data

US 2017/0179330 A1 Jun. 22, 2017

Related U.S. Application Data

(60) Division of application No. 14/640,307, filed on Mar. 6, 2015, now Pat. No. 9,640,683, which is a continuation-in-part of application No. 14/534,684, filed on Nov. 6, 2014, now Pat. No. 9,214,579.

(60) Provisional application No. 61/901,276, filed on Nov. 7, 2013.

(51) Int. Cl.
*H01L 31/18* (2006.01)
*H01L 31/02* (2006.01)
*H01L 31/0203* (2014.01)
*H01L 31/0236* (2006.01)

(52) U.S. Cl.
CPC .... *H01L 31/1804* (2013.01); *H01L 31/02002* (2013.01); *H01L 31/0203* (2013.01); *H01L 31/02363* (2013.01)

(58) Field of Classification Search
CPC .......... H01L 31/1804; H01L 31/02002; H01L 31/0203; H01L 31/02363
See application file for complete search history.

(56) References Cited

U.S. PATENT DOCUMENTS

| 6,656,828 B1 | 12/2003 | Maitani et al. |
| 2003/0077888 A1 | 4/2003 | Lee et al. |
| 2006/0103020 A1 | 5/2006 | Tong et al. |

(Continued)

FOREIGN PATENT DOCUMENTS

| CN | 101800207 | 8/2010 |
| CN | 101882625 | 11/2010 |

(Continued)

*Primary Examiner* — Peter Bradford
(74) *Attorney, Agent, or Firm* — Liu & Liu

(57) ABSTRACT

A semiconductor structure includes a silicon substrate, a protection layer, an electrical pad, an isolation layer, a redistribution layer, a conductive layer, a passivation layer, and a conductive structure. The silicon substrate has a concave region, a step structure, a tooth structure, a first surface, and a second surface opposite to the first surface. The step structure and the tooth structure surround the concave region. The step structure has a first oblique surface, a third surface, and a second oblique surface facing the concave region and connected in sequence. The protection layer is located on the first surface of the silicon substrate. The electrical pad is located in the protection layer and exposed through the concave region. The isolation layer is located on the first and second oblique surfaces, the second and third surfaces of the step structure, and the tooth structure.

9 Claims, 19 Drawing Sheets

(56) References Cited

U.S. PATENT DOCUMENTS

| | | |
|---|---|---|
| 2008/0099664 A1 | 5/2008 | Yamazaki et al. |
| 2010/0187557 A1 | 7/2010 | Samoilov et al. |
| 2011/0149493 A1 | 6/2011 | Kwon et al. |
| 2011/0233770 A1 | 9/2011 | Chiu et al. |
| 2011/0278734 A1 | 11/2011 | Yen et al. |
| 2012/0146214 A1 | 6/2012 | Soltan |
| 2012/0187515 A1 | 7/2012 | Kerness et al. |
| 2012/0205799 A1 | 8/2012 | Lin |
| 2013/0001621 A1 | 1/2013 | Shiu et al. |
| 2013/0328147 A1 | 12/2013 | Ho et al. |
| 2014/0001493 A1 | 1/2014 | Pagani et al. |
| 2015/0054002 A1 | 2/2015 | Chien et al. |
| 2015/0206916 A1* | 7/2015 | Lee ............... H01L 27/14632 257/433 |
| 2015/0255499 A1* | 9/2015 | Lee ............... H01L 27/14605 257/432 |
| 2015/0287688 A1 | 10/2015 | Lin et al. |

FOREIGN PATENT DOCUMENTS

| | | |
|---|---|---|
| CN | 102856336 | 1/2013 |
| TW | 201225300 | 6/2012 |
| TW | 201232684 | 8/2012 |
| TW | 201501250 | 1/2015 |
| TW | 201505143 | 2/2015 |
| TW | 201508886 | 3/2015 |

* cited by examiner

SEMICONDUCTOR STRUCTURE AND MANUFACTURING METHOD THEREOF

RELATED APPLICATIONS

The present application is a Divisional application of the U.S. application Ser. No. 14/640,307, filed Mar. 6, 2015, which is a Continuation-in-part of U.S. application Ser. No. 14/534,684, filed on Nov. 6, 2014, which claims priority of U.S. provisional Application Ser. No. 61/901,276, filed on Nov. 7, 2013, all of which are herein incorporated by reference.

BACKGROUND

Field of Invention

The present invention relates to a semiconductor structure and a manufacturing method of the semiconductor structure.

Description of Related Art

A conventional semiconductor structure may include a chip, an electrical pad, a dielectric layer (e.g., $SiO_2$), a redistribution layer (RDL), a conductive layer, a passivation layer, and a solder ball. In general, when the semiconductor structure is manufactured, the dielectric layer is used to cover a silicon substrate (i.e., a wafer) which is not divided yet to form plural chips, so as to protect electronic components (e.g., a light sensor) on the semiconductor structure. Thereafter, a photolithography process and an etching process may be used to remove the silicon substrate and the dielectric layer above the electrical pad that is in the dielectric layer, such that a through via is formed in the silicon substrate and the dielectric layer, and the electrical pad is exposed through the through via.

Subsequently, an isolation layer may be used to cover the surface of the silicon substrate facing away from the dielectric layer and the surface of the silicon substrate surrounding the through via. After forming the isolation layer, the redistribution layer and the conductive layer may be sequentially formed on the isolation layer and the electrical pad. After the conductive layer is formed, the passivation layer may cover the conductive layer, and an opening is formed in the passivation layer to dispose the solder ball.

However, since the conductive layer completely covers the redistribution layer, the material of the conductive layer (e.g., nickel and gold) is wasted. Moreover, after the solder ball is in electrical contact with the conductive layer, the fixity of the solder ball needs to be test by a lateral force (i.e., a shear force). Because the conductive layer completely covers the redistribution layer, when the solder ball receives the lateral force, corners of the redistribution layer and corners of the conductive layer are easily damaged, and thus the yield rate of the entire semiconductor structure is difficult to be improved.

Furthermore, the slope of the surface of the silicon substrate surrounding the through via is steep. That is to say, a via aspect ratio (depth/width) is large. Hence, the breaks of the redistribution layer and the conductive layer are prone to occur at the turning point of the silicon substrate adjacent to the through via, such that the yield rate of the semiconductor structure is difficult to be improved. Moreover, in order to reduce the via aspect ratio, although thin silicon substrates may be used to manufacture the semiconductor structure, thick silicon substrates cannot be used, which is an inconvenient factor for designers.

SUMMARY

An aspect of the present invention is to provide a manufacturing method of a semiconductor structure.

According to an embodiment of the present invention, a manufacturing method of a semiconductor structure includes the following steps. (a) A wafer structure having a silicon substrate and a protection layer is provided. An electrical pad on the protection layer is exposed through the concave region of the silicon substrate. (b) An isolation layer is formed on the sidewall of the silicon substrate surrounding the concave region and the surface of the silicon substrate facing away from the protection layer. (c) A redistribution layer is formed on the isolation layer and the electrical pad. (d) A passivation layer is formed on the redistribution layer. (e) The passivation layer is patterned to form a first opening therein, such that the redistribution layer on the surface of the silicon substrate is exposed through the first opening. (f) A first conductive layer is formed on the redistribution layer exposed through the first opening. (g) A conductive structure is arranged in the first opening, such that the conductive structure is in electrical contact with the first conductive layer.

In one embodiment of the present invention, in step (e), the passivation layer is patterned to form a second opening therein, such that the redistribution layer on the electrical pad and the sidewall is exposed through the second opening.

In one embodiment of the present invention, in step (f), a second conductive layer is formed on the redistribution layer that is exposed through the second opening.

In one embodiment of the present invention, the first conductive layer in step (f) is formed by utilizing a chemical plating process.

In one embodiment of the present invention, the isolation layer in step (b) is formed by utilizing a chemical vapor deposition process.

In one embodiment of the present invention, the wafer structure has a light transmissive element and a supporting layer that is located between the light transmissive element and the protection layer. The manufacturing method of the semiconductor structure further includes cutting the passivation layer, the silicon substrate, the protection layer, the supporting layer, and the light transmissive element.

In one embodiment of the present invention, the manufacturing method of the semiconductor structure further includes forming a tooth structure in the silicon substrate, in which the height of the tooth structure is smaller than or equal to the height of the surface of the silicon substrate.

Another aspect of the present invention is to provide a semiconductor structure.

According to an embodiment of the present invention, a semiconductor structure includes a silicon substrate, a protection layer, an electrical pad, an isolation layer, a redistribution layer, a passivation layer, a first conductive layer, and a conductive structure. The silicon substrate has a light sensor and a concave region. The protection layer is located on the silicon substrate and covers the light sensor. The electrical pad is located on the protection layer and aligned with the concave region. The isolation layer is located on the sidewall of the silicon substrate surrounding the concave region and a surface of the silicon substrate facing away from the protection layer. The redistribution layer is located on the isolation layer and the electrical pad. The passivation layer is located on the redistribution layer and has a first opening. The first conductive layer is located on the redistribution layer that is exposed through the first opening. The conductive structure is located in the first opening and in electrical contact with the first conductive layer.

In one embodiment of the present invention, the passivation layer has a second opening, and the redistribution layer located on the electrical pad and the sidewall is exposed through the second opening.

In one embodiment of the present invention, the semiconductor structure further includes a second conductive layer. The second conductive layer is located on the redistribution layer that is exposed through the second opening.

In one embodiment of the present invention, the perpendicular height of the second conductive layer is smaller than the perpendicular height of the surface of the silicon substrate.

In one embodiment of the present invention, the caliber of the concave region is gradually increased toward the electrical pad, such that the sidewall of the silicon substrate is an oblique surface.

In one embodiment of the present invention, the isolation layer is made of a material including oxide or nitride.

In one embodiment of the present invention, the semiconductor structure further includes a light transmissive element and a supporting layer. The supporting layer is located between the light transmissive element and the protection layer.

In one embodiment of the present invention, the silicon substrate further includes a tooth structure. The tooth structure is located adjacent to the concave region, and the height of the tooth structure is smaller than or equal to the height of the surface of the silicon substrate. The top end of the tooth structure is cusp-shaped, round-shaped, or flat-shaped.

In one embodiment of the present invention, the conductive structure is a solder ball or a conductive protruding block.

In the aforementioned embodiments of the present invention, since the first conductive layer is only formed on the redistribution layer that is exposed through the first opening and does not completely cover redistribution layer, the material cost of the first conductive layer may be reduced. Moreover, when the conductive structure is located on the first conductive layer in the first opening, the conductive structure is in electrical contact with the first conductive layer. When the conductive structure receives a lateral force (i.e., a shear force) for testing its fixity, corners or edges of the redistribution layer and the first conductive layer are not easily damaged because the first conductive layer is only formed on the redistribution layer that is exposed through the first opening. As a result, the yield rate of the entire semiconductor structure can be improved.

An aspect of the present invention is to provide a semiconductor structure.

According to an embodiment of the present invention, a semiconductor structure includes a silicon substrate, a protection layer, an electrical pad, an isolation layer, a redistribution layer, a conductive layer, a passivation layer, and a conductive structure. The silicon substrate has a concave region, a step structure, a tooth structure, a first surface, and a second surface opposite to the first surface. The step structure and the tooth structure surround the concave region. The step structure has a first oblique surface, a third surface, and a second oblique surface facing the concave region and connected in sequence. The protection layer is located on the first surface of the silicon substrate. The electrical pad is located in the protection layer and exposed through the concave region. The isolation layer is located on the first and second oblique surfaces, the second and third surfaces of the step structure, and the tooth structure. The redistribution layer is located on the isolation layer and the electrical pad. The conductive layer is located on the redistribution layer. The passivation layer covers the step structure and the tooth structure and has an opening to expose the conductive layer. The conductive structure is located on the conductive layer that is in the opening of the passivation layer.

Another aspect of the present invention is to provide a manufacturing method of a semiconductor structure.

According to an embodiment of the present invention, a manufacturing method of a semiconductor structure includes the following steps. A wafer structure having a silicon substrate, an electrical pad, and a protection layer is provided. The silicon substrate has a first surface and a second surface opposite to the first surface, the protection layer is located on the first surface, and the electrical pad is located in the protection layer. The silicon substrate is etched to form a cutting trench and a through hole that is aligned with the electrical pad. The silicon substrate has a first portion and a second portion surrounding the through hole, and the second portion is between the cutting trench and the through hole. A photoresist layer is formed on the second surface of the first portion of the silicon substrate. The first and second portions of the silicon substrate are etched, such that the first portion forms a step structure, the second portion forms a tooth structure, and the through hole forms a concave region that is surrounded by the step structure and the tooth structure. The step structure has a first oblique surface, a third surface, and a second oblique surface that face the concave region and are connected in sequence. The photoresist layer is removed.

In the aforementioned embodiments of the present invention, after the cutting trench and the through hole that is aligned with the electrical pad are formed in the silicon substrate, the photoresist layer is formed on the second surface of the first portion of the silicon substrate. As a result, in a subsequent process for etching the first portion of the silicon substrate, since the first portion adjacent to the second surface of the silicon substrate is protected by the photoresist layer, the step structure is formed by side-etching. The step structure has the first oblique surface, the third surface, and the second oblique surface that are connected in sequence, and a distance between the first and third surfaces is smaller than a distance between the first and second surfaces. Hence, a via aspect ratio of the concave region may be reduced, such that the breaks of the redistribution layer and the conductive layer at the turning point of the silicon substrate adjacent to the concave region may be prevented, thereby improving the yield rate of the semiconductor structure. Moreover, thick silicon substrates may be used in the semiconductor structure and the manufacturing method thereof of the present invention, which is a convenient factor for the selection of materials for designers.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
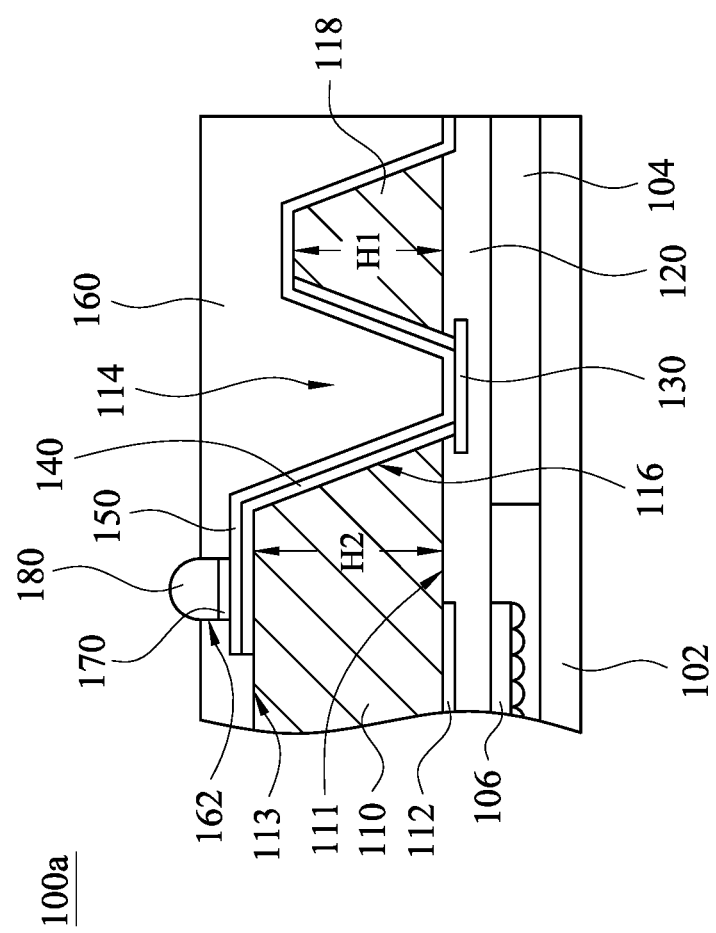
FIG. 1 is a cross-sectional view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor structure 100a according to one embodiment of the present invention. As shown in FIG. 1, the semiconductor structure 100a includes a silicon substrate 110, a protection layer 120, an electrical pad 130, an isolation layer 140, a redistribution layer 150, a passivation layer 160, a first conductive layer 170, and a conductive structure 180. The silicon substrate 110 has a light sensor 112 and a concave region 114. The protection layer 120 is located on the surface 111 of the silicon substrate 110 and covers the light sensor 112, such that the light sensor 112 is protected by the protection layer 120. Moreover, the electrical pad 130 is located on the protection layer 120 and aligned with the concave region 114 of the silicon substrate 110. The isolation layer 140 is located on a sidewall 116 of the silicon substrate 110 surrounding the concave region 114 and a surface 113 of the silicon substrate 110 facing away from the protection layer 120. The redistribution layer 150 is located on the isolation layer 140 and the electrical pad 130. The passivation layer 160 is located on the redistribution layer 150 and has a first opening 162. The passivation layer 160 can prevent moisture and dust from entering the semiconductor structure 100a. The first conductive layer 170 is located on the redistribution layer 150 that is exposed through the first opening 162. The conductive structure 180 is located in the first opening 162 and in electrical contact with the first conductive layer 170.

Since the first conductive layer 170 is only formed on the redistribution layer 150 that is exposed through the first opening 162 and does not completely cover redistribution layer 150, the material cost of the first conductive layer 170 may be reduced. Moreover, when the conductive structure 180 is located on the first conductive layer 170 in the first opening 162, the conductive structure 180 is in electrical contact with the first conductive layer 170. When the conductive structure 180 receives a lateral force F (i.e., a shear force) for testing the fixity of the conductive structure 180, corners (edges) of the redistribution layer 150 and corners (or edges) of the first conductive layer 170 are not easily damaged because the first conductive layer 170 is only formed on the redistribution layer 150 that is exposed through the first opening 162. As a result, the yield rate of the entire semiconductor structure 100a can be improved.

In addition, the semiconductor structure 100a may further include a light transmissive element 102, a supporting layer 104, and a color filter 106. The supporting layer 104 is located between the light transmissive element 102 and the protection layer 120, such that the light transmissive element 102 is spaced from the protection layer 120 at a distance. The color filter 106 is disposed on a surface of the protection layer 120 facing away from the silicon substrate 110. The color filter 106 is aligned with the light sensor 112 of the silicon substrate 110. After light enters the light transmissive element 102, the light passes through the color filter 106 and is detected by the light sensor 112.

In this embodiment, the silicon substrate 110 may be an image sensing element, a MEMS (Microelectromechanical System) element, an operation processing element, etc. The silicon substrate 110 may be made of a material including silicon. The silicon substrate 110 may be one of chips that are formed by performing a cutting (dicing) process on a wafer. The protection layer 120 and the passivation layer 160 may be made of a material including silicon oxide, such as $SiO_2$. The isolation layer 140 may be made of a material including oxide or nitride. The electrical pad 130 may be made of a material including copper, the redistribution layer 150 may be made of a material including aluminum, and the first conductive layer 170 may be made of a material including nickel and gold. The conductive structure 180 may be a solder ball or a conductive protruding block. Moreover, the light transmissive element 102 may be a glass plate, and the supporting layer 104 may be made of a material including epoxy. However, the present invention is not limited to the aforesaid materials.

Moreover, the silicon substrate 110 may further include a tooth structure 118. The tooth structure 118 is located adjacent to the concave region 114, and the height H1 of the tooth structure 118 is smaller than or equal to the height H2 of the surface 113 of the silicon substrate 110 (i.e., the back surface of the silicon substrate 110). The top end of the tooth structure 118 may be cusp-shaped, round-shaped, or flat-shaped.

It is to be noted that the connection relationships of the elements described above will not be repeated in the following description. In the following description, a manufacturing method of the semiconductor structure 100a will be described.

Figure 2:
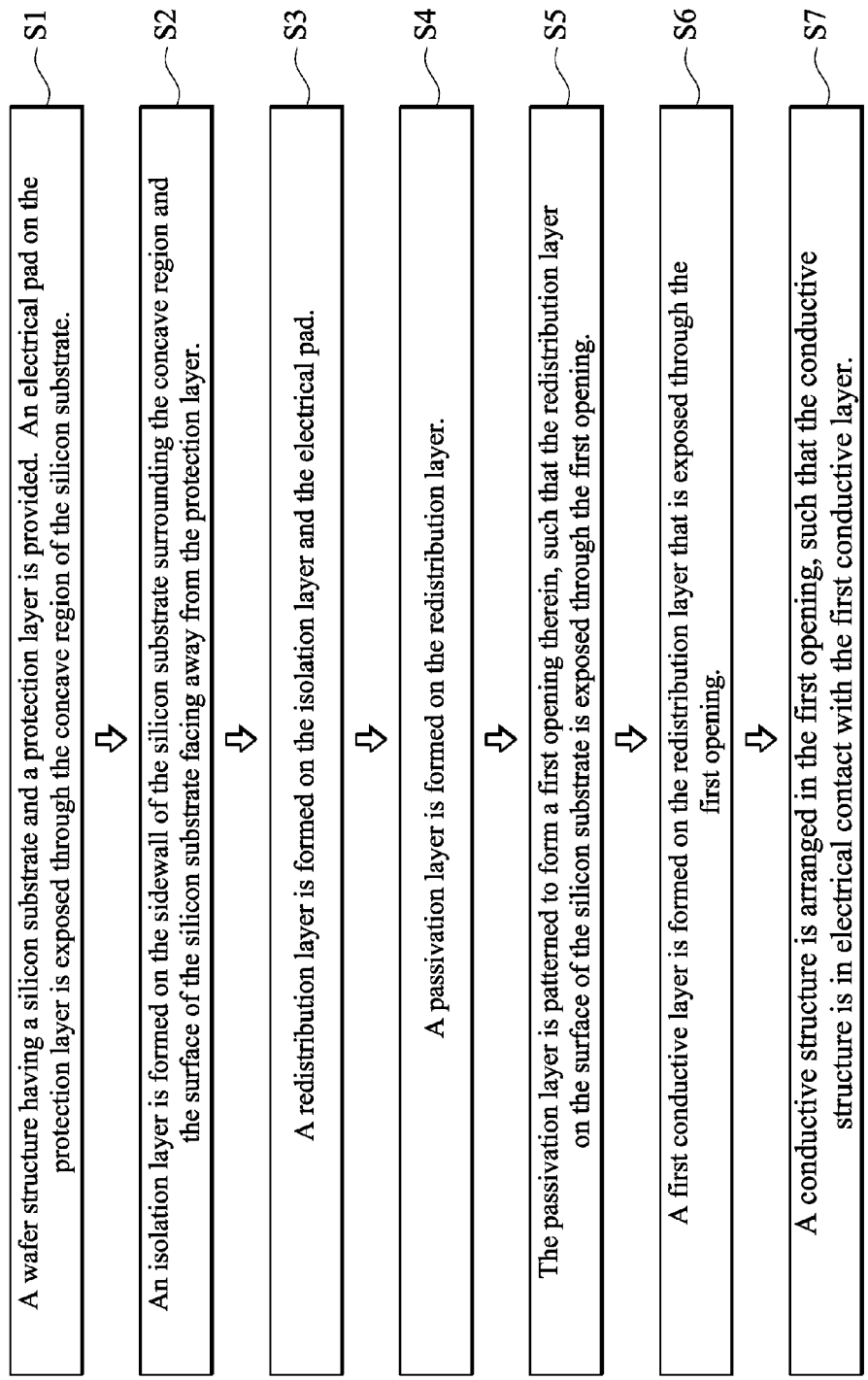
FIG. 2 is a flow chart of a manufacturing method of a semiconductor structure according to one embodiment of the present invention.

FIG. 2 is a flow chart of a manufacturing method of a semiconductor structure according to one embodiment of the present invention. In step S1, a wafer structure having a silicon substrate and a protection layer is provided. An electrical pad on the protection layer is exposed through the concave region of the silicon substrate. Thereafter, in step S2, an isolation layer is formed on the sidewall of the silicon substrate surrounding the concave region and the surface of the silicon substrate facing away from the protection layer. Next, in step S3, a redistribution layer is formed on the isolation layer and the electrical pad. Then, in step S4, a passivation layer is formed on the redistribution layer. Thereafter, in step S5, the passivation layer is patterned to form a first opening therein, such that the redistribution layer located on the surface of the silicon substrate is exposed through the first opening. Next, in step S6, a first conductive layer is formed on the redistribution layer that is exposed through the first opening. Thereafter, in step S7, a conductive structure is arranged in the first opening, such that the conductive structure is in electrical contact with the first conductive layer.

In the following description, the respective steps of the aforementioned manufacturing method of the semiconductor structure will be described, and the silicon substrate 110 is used to represent a wafer which is not divided yet to form plural chips.

Figure 3:
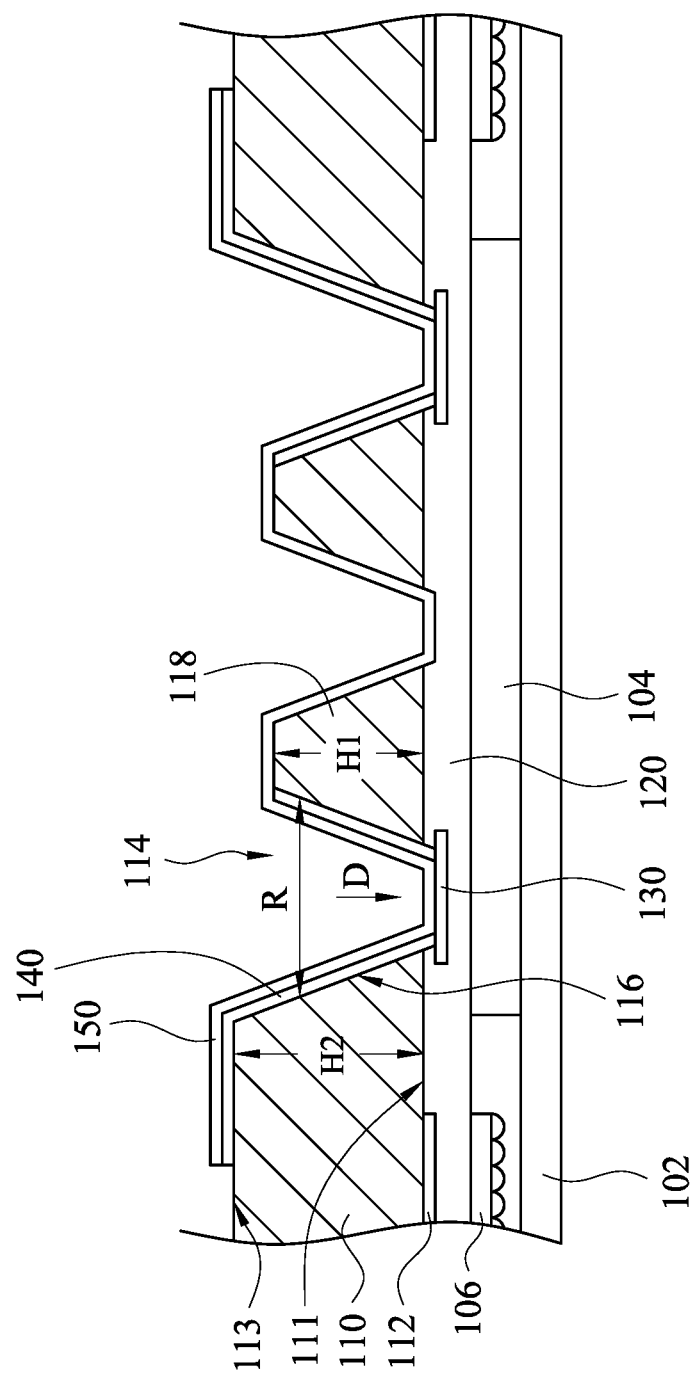
FIG. 3 is a cross-sectional view of an isolation layer and a redistribution layer after being formed on a silicon substrate shown in FIG. 2.

FIG. 3 is a cross-sectional view of the isolation layer 140 and the redistribution layer 150 after being formed on a silicon substrate 110 shown in FIG. 2. A wafer structure having the silicon substrate 110 and the protection layer 120 is provided. The electrical pad 130 on the protection layer 120 is exposed through the concave region 114 of the silicon substrate 110. An etching process may be performed on the silicon substrate 110 to form the concave region 114. In this embodiment, when the concave region 114 is formed, a tooth structure 118 may be formed in the silicon substrate 110, and the height H1 of the tooth structure 118 is smaller than or equal to the height H2 of the surface 113 of the silicon substrate 110. Thereafter, the isolation layer 140 may be formed on the sidewall 116 of the silicon substrate 110 surrounding the concave region 114 and the surface 113 of the silicon substrate 110 facing away from the protection layer 120. For example, the isolation layer 140 may be formed by utilizing a chemical vapor deposition (CVD) process, but the present invention is not limited in this regard. After forming the isolation layer 140, the redistribution layer 150 may be formed on the isolation layer 140 and the electrical pad 130.

In this embodiment, the caliber R of the concave region 114 is gradually increased toward the electrical pad 130 in a direction D, such that the sidewall 116 of the silicon substrate 110 is an oblique surface. As a result, the included angle between the sidewall 116 and the electrical pad 130 is an obtuse angle, so as to prevent the redistribution layer 150 on the connection position that is between the sidewall 116 and the electrical pad 130 from being broken.

Figure 4:
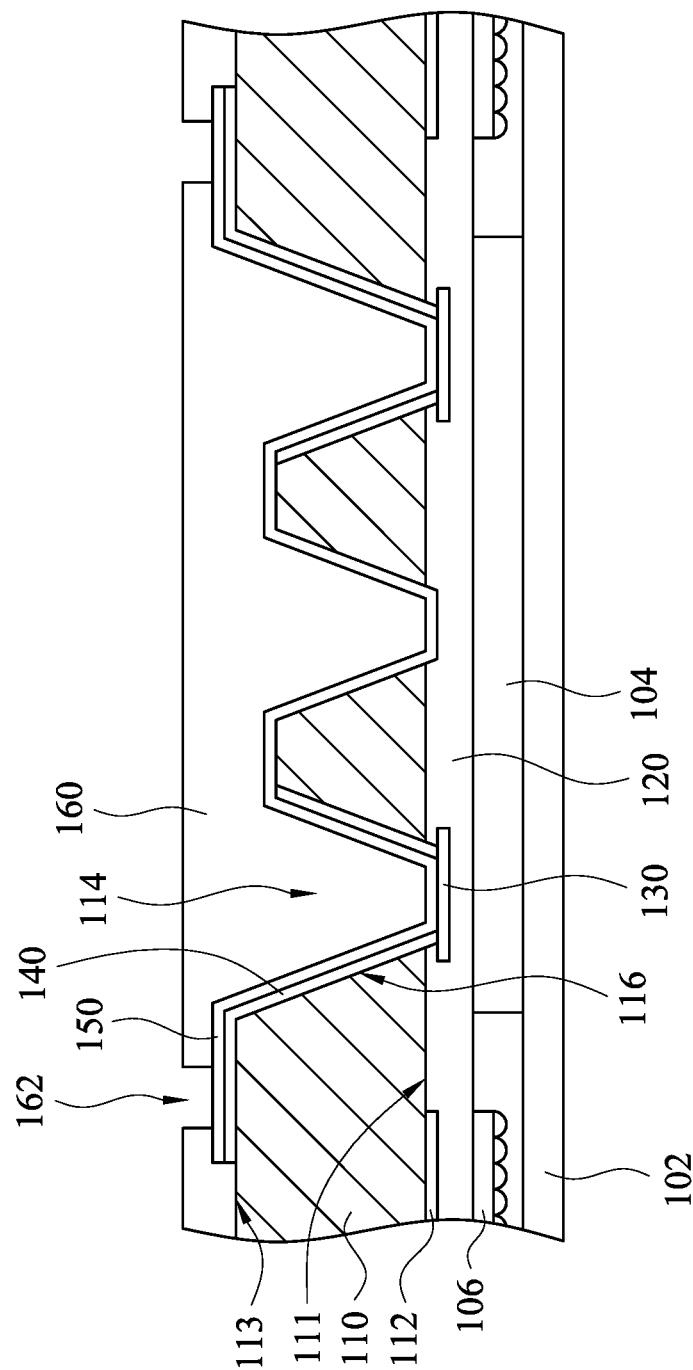
FIG. 4 is a cross-sectional view of a passivation layer after being formed on the redistribution layer shown in FIG. 3.

FIG. 4 is a cross-sectional view of the passivation layer 160 after being formed on the redistribution layer 150 shown in FIG. 3. As shown in FIG. 3 and FIG. 4, after the redistribution layer 150 is formed on the isolation layer 140 and the electrical pad 130, the passivation layer 160 may be formed on the redistribution layer 150 and cover the concave region 114. Thereafter, the passivation layer 160 may be patterned to form the first opening 162 therein, such that the redistribution layer 150 located on the surface 113 of the silicon substrate 110 is exposed through the first opening 162 of the passivation layer 160. The patterning process may be a photolithography technique including exposure, development, and etching processes.

Figure 5:
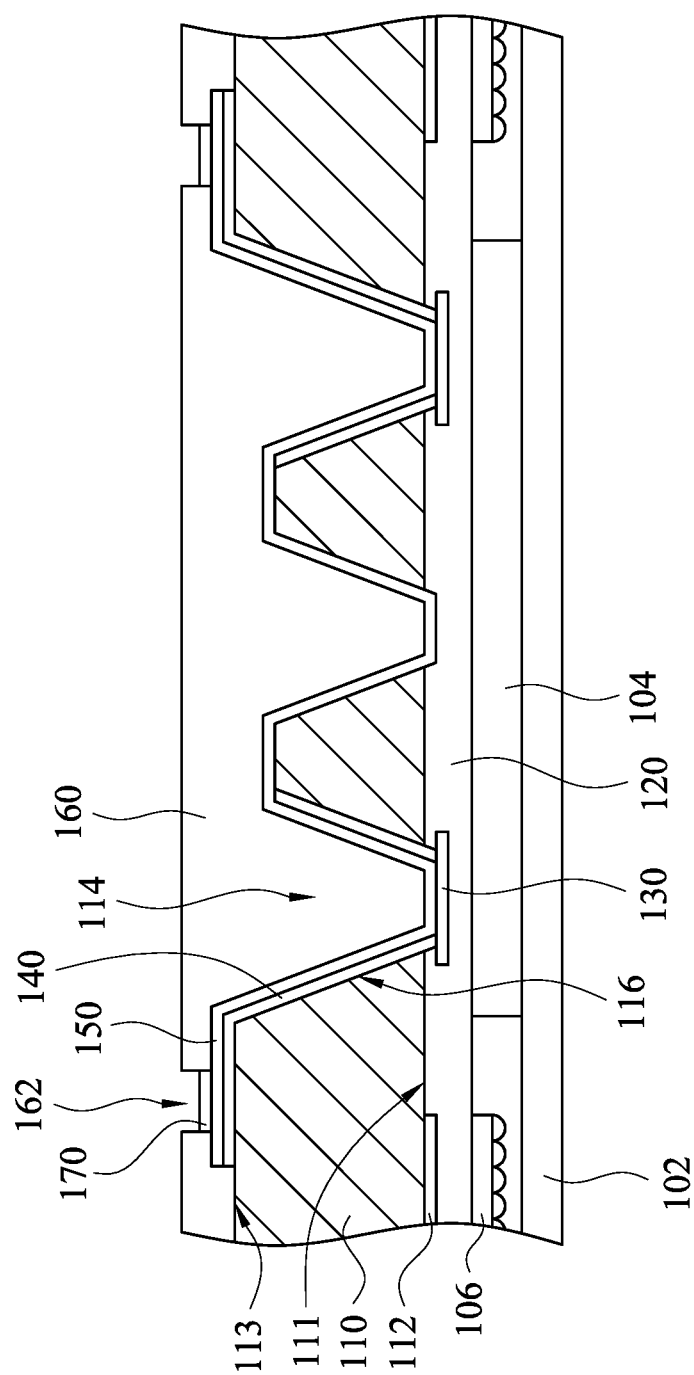
FIG. 5 is a cross-sectional view of a first conductive layer after being formed on the redistribution layer that is exposed through a first opening shown in FIG. 4.

FIG. 5 is a cross-sectional view of the first conductive layer 170 after being formed on the redistribution layer 150 that is exposed through the first opening 162 shown in FIG. 4. As shown in FIG. 4 and FIG. 5, after a portion of the redistribution layer 150 is exposed through the first opening 162 of the passivation layer 160, the first conductive layer 170 may be formed on the redistribution layer 150 that is exposed through the first opening 162. Since the redistribution layer 150 is made of metal (e.g., aluminum), the first conductive layer 170 may be formed on the redistribution layer 150 that is exposed through the first opening 162 by utilizing a chemical plating process. The first conductive layer 170 may be made of a material including nickel and gold. When the first conductive layer 170 is manufactured, the structure shown in FIG. 4 may be immersed in nickel solution, and subsequently immersed in gold solution, such that the first conductive layer 170 with nickel and gold can be formed on the redistribution layer 150 that is exposed through the first opening 162.

Figure 6:
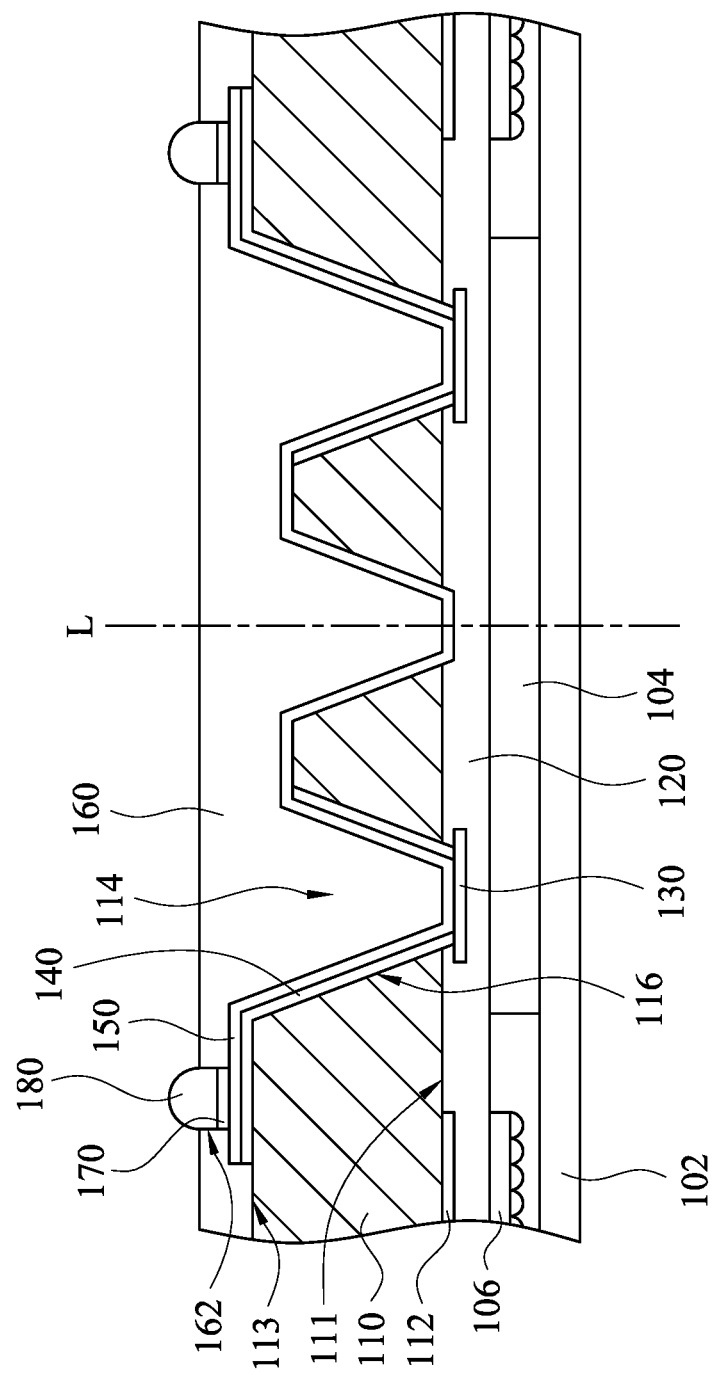
FIG. 6 is a cross-sectional view of a conductive structure after being disposed on the first conductive layer shown in FIG. 5.

FIG. 6 is a cross-sectional view of the conductive structure 180 after being disposed on the first conductive layer 170 shown in FIG. 5. As shown in FIG. 5 and FIG. 6, after the first conductive layer 170 is formed on the redistribution layer 150 that is exposed through the first opening 162, the conductive structure 180 may be arranged in the first opening 162 of the passivation layer 160, such that the conductive structure 180 may be in electrical contact with the first conductive layer 170. Thereafter, the passivation layer 160, the silicon substrate 110, the protection layer 120, the supporting layer 104, and the light transmissive element 102 may be divided along line L. As a result, the semiconductor structure 100a shown in FIG. 1 can be obtained.

Figure 7:
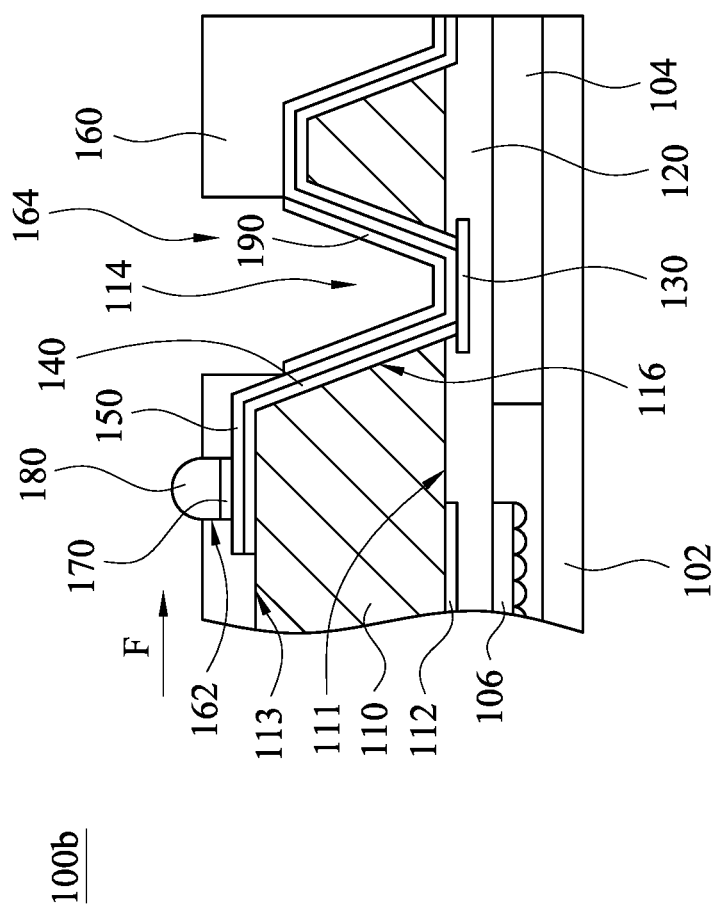
FIG. 7 is a cross-sectional view of a semiconductor structure according to one embodiment of the present invention.

FIG. 7 is a cross-sectional view of a semiconductor structure 100b according to one embodiment of the present invention. As shown in FIG. 7, the semiconductor structure 100b includes the silicon substrate 110, the protection layer 120, the electrical pad 130, the isolation layer 140, the redistribution layer 150, the passivation layer 160, the first conductive layer 170, and the conductive structure 180. The difference between this embodiment and the embodiment shown in FIG. 1 is that the passivation layer 160 has a second opening 164, and the redistribution layer 150 located on the electrical pad 130 and the sidewall 116 of the silicon substrate 110 is exposed through the second opening 164 of the passivation layer 160. Moreover, the semiconductor structure 100b further includes a second conductive layer 190. The second conductive layer 190 is located on the redistribution layer 150 that is exposed through the second opening 164.

In this embodiment, the perpendicular height of the second conductive layer 190 is smaller than the perpendicular height of the surface 113 of the silicon substrate 110 facing away from the protection layer 120. That is to say, the second conductive layer 190 is under the surface 113 of the silicon substrate 110.

It is to be noted that the connection relationships of the elements described above will not be repeated in the following description. In the following description, the manufacturing method of the semiconductor structure 100b will be described.

Figure 8:
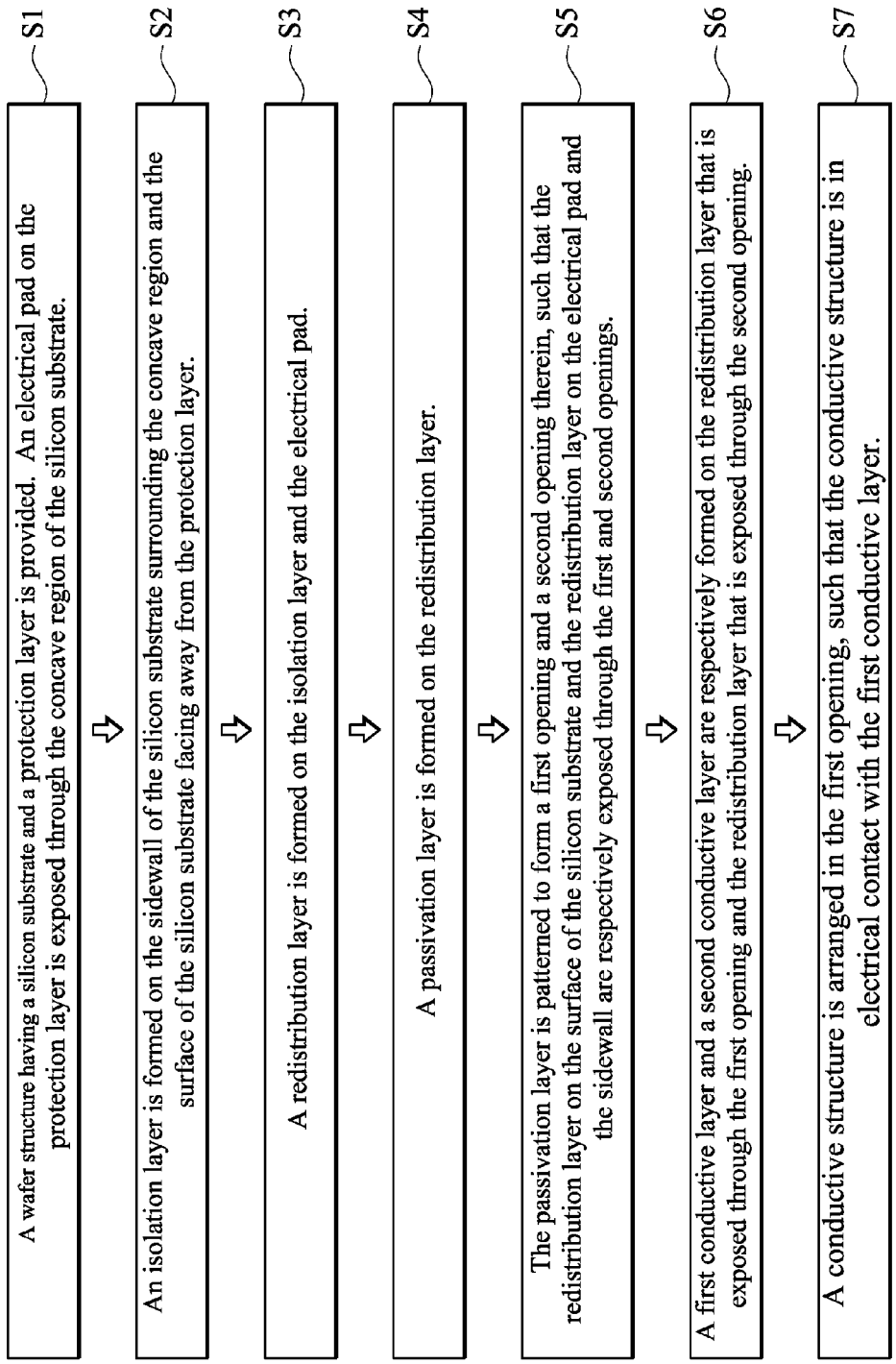
FIG. 8 is a flow chart of a manufacturing method of a semiconductor structure according to one embodiment of the present invention.

FIG. 8 is a flow chart of a manufacturing method of a semiconductor structure according to one embodiment of the present invention. In step S1, a wafer structure having a silicon substrate and a protection layer is provided. An electrical pad on the protection layer is exposed through the concave region of the silicon substrate. Thereafter, in step S2, an isolation layer is formed on the sidewall of the silicon substrate surrounding the concave region and the surface of the silicon substrate facing away from the protection layer. Next, in step S3, a redistribution layer is formed on the isolation layer and the electrical pad. Then, in step S4, a passivation layer is formed on the redistribution layer. Thereafter in step S5, the passivation layer is patterned to form a first opening and a second opening therein, such that the redistribution layer on the surface of the silicon substrate and the redistribution layer on the electrical pad and the sidewall are respectively exposed through the first and second openings. Next, in step S6, a first conductive layer and a second conductive layer are respectively formed on the redistribution layer that is exposed through the first opening and the redistribution layer that is exposed through the second opening. Thereafter, in step S7, a conductive structure is arranged in the first opening, such that the conductive structure is in electrical contact with the first conductive layer.

In the following description, the aforementioned manufacturing method of the semiconductor structure will be described, and a silicon substrate 110 is referred to as a wafer which is not divided yet to form plural chips.

The structure shown in FIG. 3 is provided, and the electrical pad 130 on the protection layer 120 is exposed through the concave region 114 of the silicon substrate 110. The isolation layer 140 is formed on the sidewall 116 of the silicon substrate 110 surrounding the concave region 114 and the surface 113 of the silicon substrate 110 facing away from the protection layer 120. The redistribution layer 150 is formed on the isolation layer 140 and the electrical pad 130.

Figure 9:
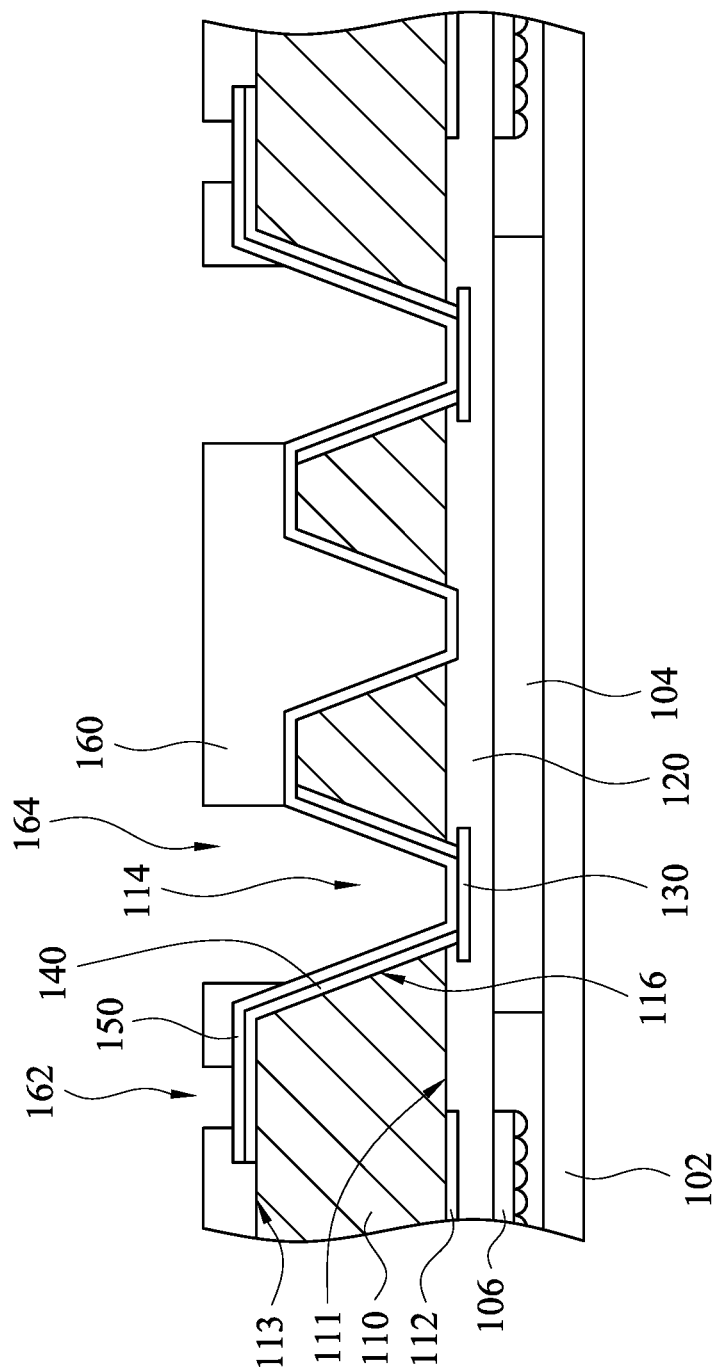
FIG. 9 is a cross-sectional view of a passivation layer after being formed on a redistribution layer shown in FIG. 8.

FIG. 9 is a cross-sectional view of the passivation layer 160 after being formed on the redistribution layer 150 shown in FIG. 8. After the redistribution layer 150 is formed on the isolation layer 140 and the electrical pad 130, the passivation layer 160 may be formed on the redistribution layer 150 and cover the concave region 114. Thereafter, the passivation layer 160 may be patterned to form the first opening 162 and the second opening 164 therein, such that the redistribution layer 150 on the surface 113 of the silicon substrate 110 is exposed through the first opening 162 of the passivation layer 160, and the redistribution layer 150 located on the electrical pad 130 and the sidewall 116 is exposed through the second opening 164 of the passivation layer 160.

Figure 10:
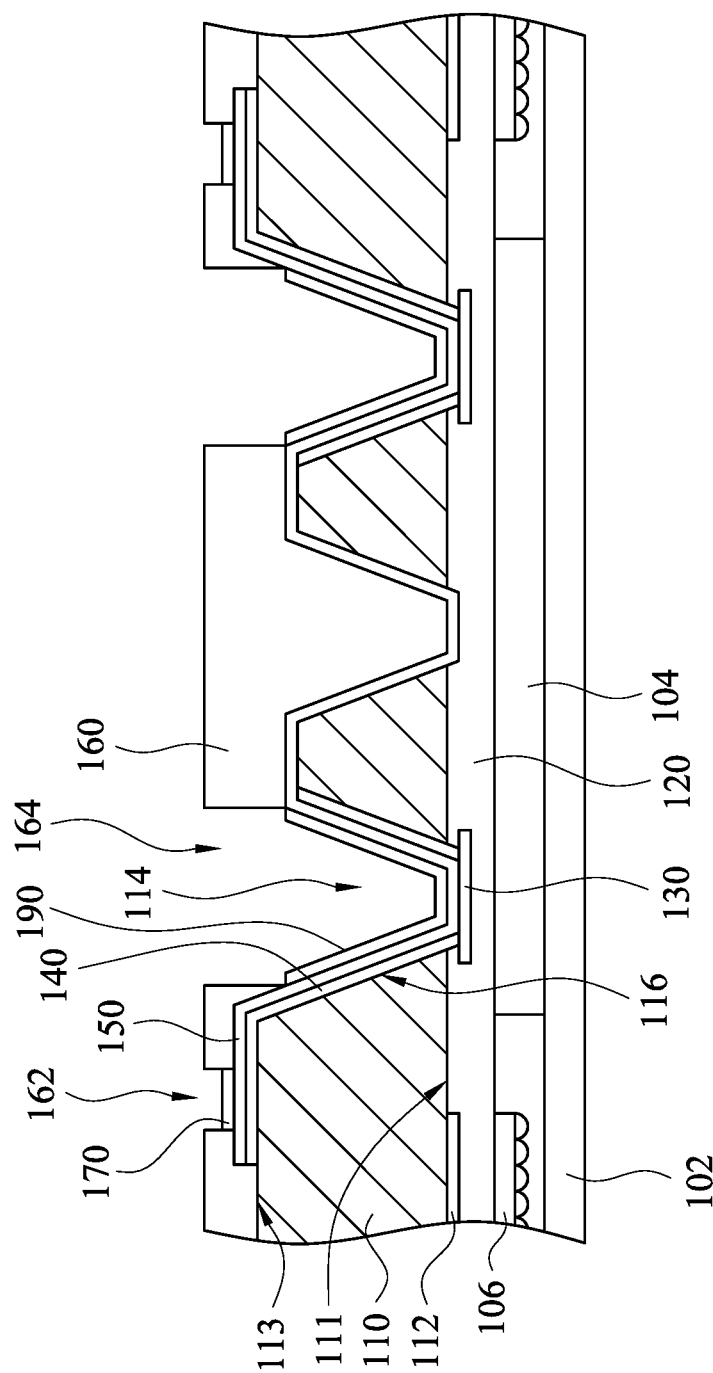
FIG. 10 is a cross-sectional view of a first conductive layer and a second conductive layer after being respectively formed on the redistribution layer exposed through a first opening and a second opening shown in FIG. 9.

FIG. 10 is a cross-sectional view of the first conductive layer 170 and the second conductive layer 190 after being respectively formed on the redistribution layer 150 that is exposed through the first and second openings 162, 164 shown in FIG. 9. As shown in FIG. 9 and FIG. 10, after the redistribution layer 150 is exposed through the first and second openings 162, 164 of the passivation layer 160, the first conductive layer 170 may be formed on the redistribution layer 150 that is exposed through the first opening 162, and the second conductive layer 190 may be formed on the redistribution layer 150 that is exposed through the second opening 164. Since the redistribution layer 150 is made of metal (e.g., aluminum), the first conductive layer 170 and the second conductive layer 190 may be respectively formed on the redistribution layer 150 that is exposed through the first opening 162, and the redistribution layer 150 that is exposed through the second opening 164 by utilizing a chemical plating process. When the first and second conductive layers 170, 190 are manufactured, the structure shown in FIG. 9 may be immersed in nickel solution, and then immersed in gold solution, such that the first conductive layer 170 with nickel and gold can be formed on the redistribution layer 150 that is exposed through the first opening 162, and the second conductive layer 190 with nickel and gold may be formed on the redistribution layer 150 that is exposed through the second opening 164.

Figure 11:
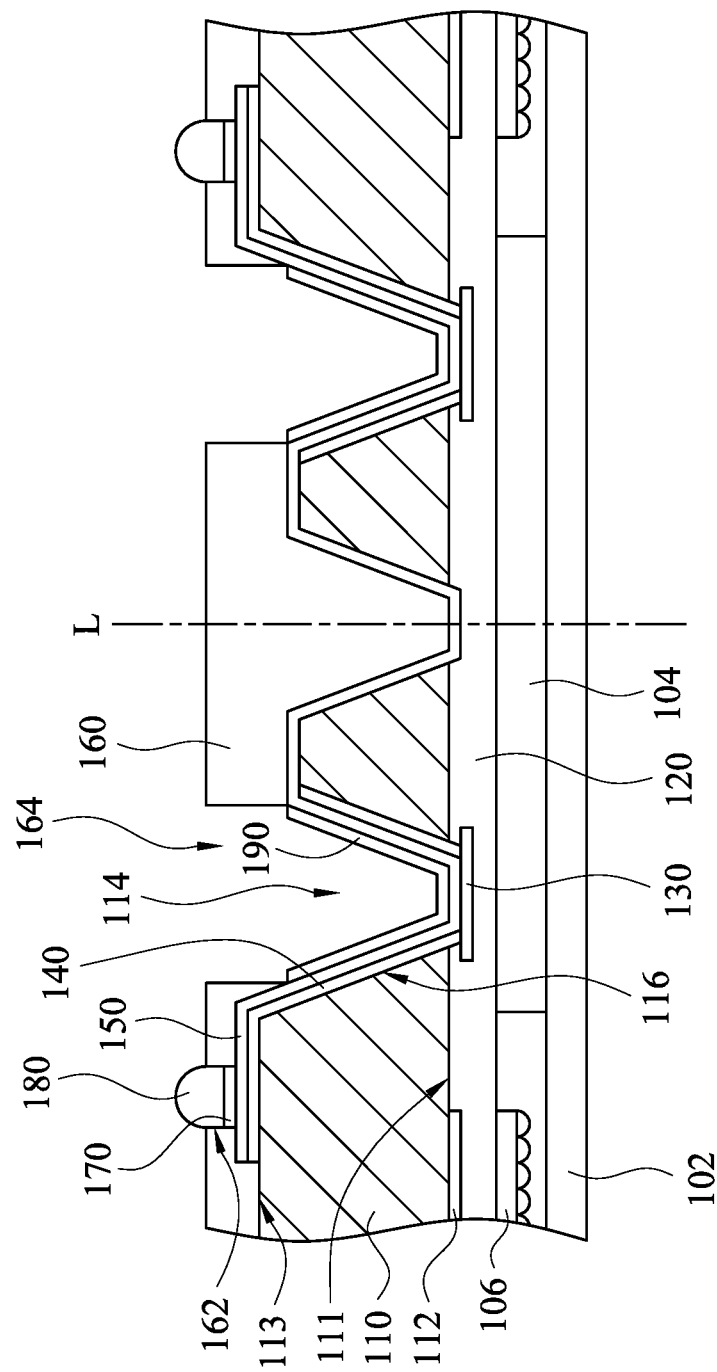
FIG. 11 is a cross-sectional view of a conductive structure after being disposed on the first conductive layer shown in FIG. 10.

FIG. 11 is a cross-sectional view of the conductive structure 180 after being disposed on the first conductive layer 170 shown in FIG. 10. As shown in FIG. 10 and FIG. 11, after the first conductive layers 170 and the second conductive layer 190 are respectively formed on the redistribution layer 150 that is exposed through the first opening 162, and the redistribution layer 150 that is exposed through the second opening 164, the conductive structure 180 may be arranged in the first opening 162 of the passivation layer 160, such that the conductive structure 180 is in electrical contact with the first conductive layer 170. Thereafter, the passivation layer 160, the silicon substrate 110, the protection layer 120, the supporting layer 104, and the light transmissive element 102 may be divided along line L. As a result, the semiconductor structure 100b shown in FIG. 7 can be obtained.

Figure 12:
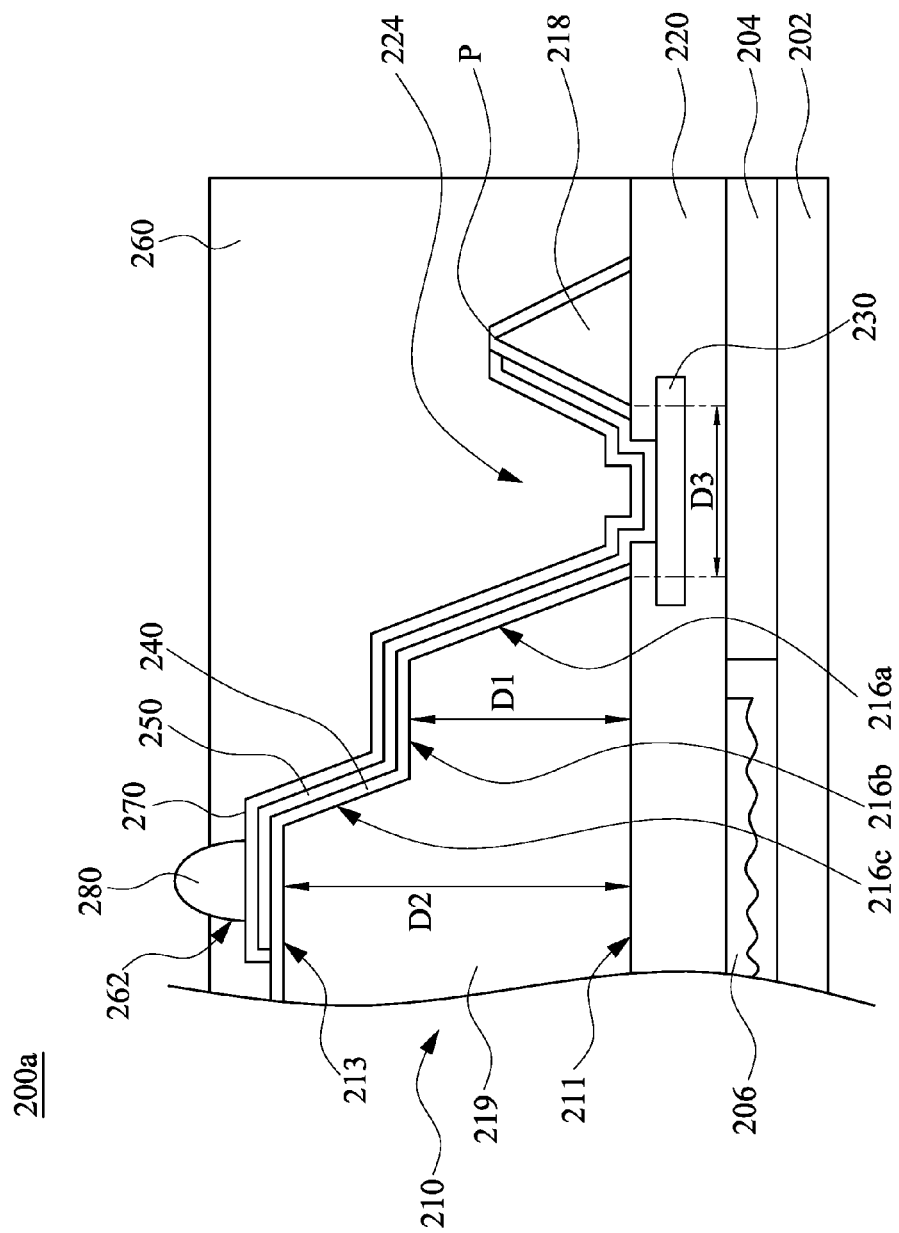
FIG. 12 is a cross-sectional view of a semiconductor structure according to one embodiment of the present invention.

FIG. 12 is a cross-sectional view of a semiconductor structure 200a according to one embodiment of the present invention. As shown in FIG. 12, a semiconductor structure 200a includes a silicon substrate 210, a protection layer 220, an electrical pad 230, an isolation layer 240, a redistribution layer 250, a conductive layer 270, a passivation layer 260, and a conductive structure 280. The silicon substrate 210 has a concave region 224, a step structure 219, a tooth structure 218, a first surface 211, and a second surface 213 opposite to the first surface 211. The step structure 219 and the tooth structure 218 surround the concave region 224. In this embodiment, the height of the step structure 219 is greater than the height of the tooth structure 218. The top end P of the tooth structure 218 may be cusp-shaped, round-shaped, or flat-shaped.

The step structure 219 has a first oblique surface 216a, a third surface 216b, and a second oblique surface 216c that are connected in sequence, and the first oblique surface 216a, the third surface 216b, and the second oblique surface 216c face the concave region 224. In this embodiment, each of the first, second, and third surfaces 211, 213, 216b may be a horizontal surface, but the present invention is not limited in this regard. The distance D1 between the first and third surfaces 211, 216b of the silicon substrate 210 is smaller than the distance D2 between the first and second surfaces 211, 213. That is to say, the height of the third surface 216b is lower than the height of the second surface 213.

Moreover, the protection layer 220 is located on the first surface 211 of the silicon substrate 210. The electrical pad 230 is located in the protection layer 220 and exposed through the concave region 224. The caliber of the concave region 224 is gradually decreased toward the electrical pad 230. The isolation layer 240 is located on the first oblique surface 216a, the third surface 216b, the second oblique surface 216c, and the second surface 213 of the step structure 219, and the tooth structure 218. The redistribution layer 250 is located on the isolation layer 240 and the electrical pad 230. The conductive layer 270 is located on the redistribution layer 250. The passivation layer 260 covers the step structure 219 and the tooth structure 218, and the passivation layer 260 has an opening 262, such that the conductive layer 270 is exposed through the opening 262. The conductive structure 280 is located on the conductive layer 270 that is in the opening 262 of the passivation layer 260. In this embodiment, the conductive structure 280 is located on the conductive layer 270 that is on the second surface 213 of the step structure 219. The conductive structure 280 may be electrically connected to the electrical pad 230 through the redistribution layer 250 and the conductive layer 270.

Since the silicon substrate 210 of the semiconductor structure 200a has the step structure 219 and the step structure 219 has the first oblique surface 216a, the third surface 216b, the second oblique surface 216c that are connected in sequence, the distance D1 between the first and third surfaces 211, 216b of the silicon substrate 210 is smaller than the distance D2 between the first and second surfaces 211, 213 such that the via aspect ratio (depth/width) of the concave region 224 may be effectively reduced. For example, the distance D1 is 85 µm, the distance D2 is 110 µm, and the distance D3 between the tooth structure 218 and the step structure 219 is 50 µm. Therefore, the via aspect ratio of the concave region 224 may be reduced from 2.2 (i.e., 110/50) to 1.7 (i.e., 85/50). The step structure 219 may prevent the redistribution layer 250 and the conductive layer 270 at the turning point of the silicon substrate 210 adjacent to the concave region 224 from breaking, thereby improving the yield rate of the semiconductor structure 200a. Moreover, thick silicon substrates 210 may be used to manufacture the semiconductor structure 200a of the present invention due to the step structure 219, which is a convenient factor for the selection of materials for designers.

In this embodiment, the silicon substrate 210 may be one of chips that are formed by performing a cutting (dicing) process on a wafer, which may be used to manufacture an image sensing element, a fingerprint sensor, a MEMS element, an operation processing element, etc. The protection layer 220 and the isolation layer 240 may be made of a material including silicon oxide, such as SiO2. The protection layer 220 may include an inter-metal dielectric (IMD) layer and a passivation layer. The passivation layer 260 may be made of a material including epoxy, thereby preventing moisture and dust from entering the semiconductor structure 200a. The redistribution layer 250 may be made of a material including aluminum. The conductive layer 270 may be made of a material including nickel and gold. The conductive structure 280 may be a solder ball of a ball grid array (BGA) or a conductive protruding block.

In addition, the semiconductor structure 200a may further include a light transmissive element 202, a supporting layer 204, and a color filter 206. The supporting layer 204 is between the light transmissive element 202 and the protection layer 220, such that a gap is formed between the light transmissive element 202 and the protection layer 220. The color filter 206 is disposed on the surface of the protection layer 220 facing away from the silicon substrate 210. The light transmissive element 202 may be a glass plate. The supporting layer 204 may be made of a material including epoxy. However, the present invention is not limited to the aforementioned materials.

It is to be noted that the connection relationships and the materials of the elements described above will not be repeated in the following description.

Figure 13:
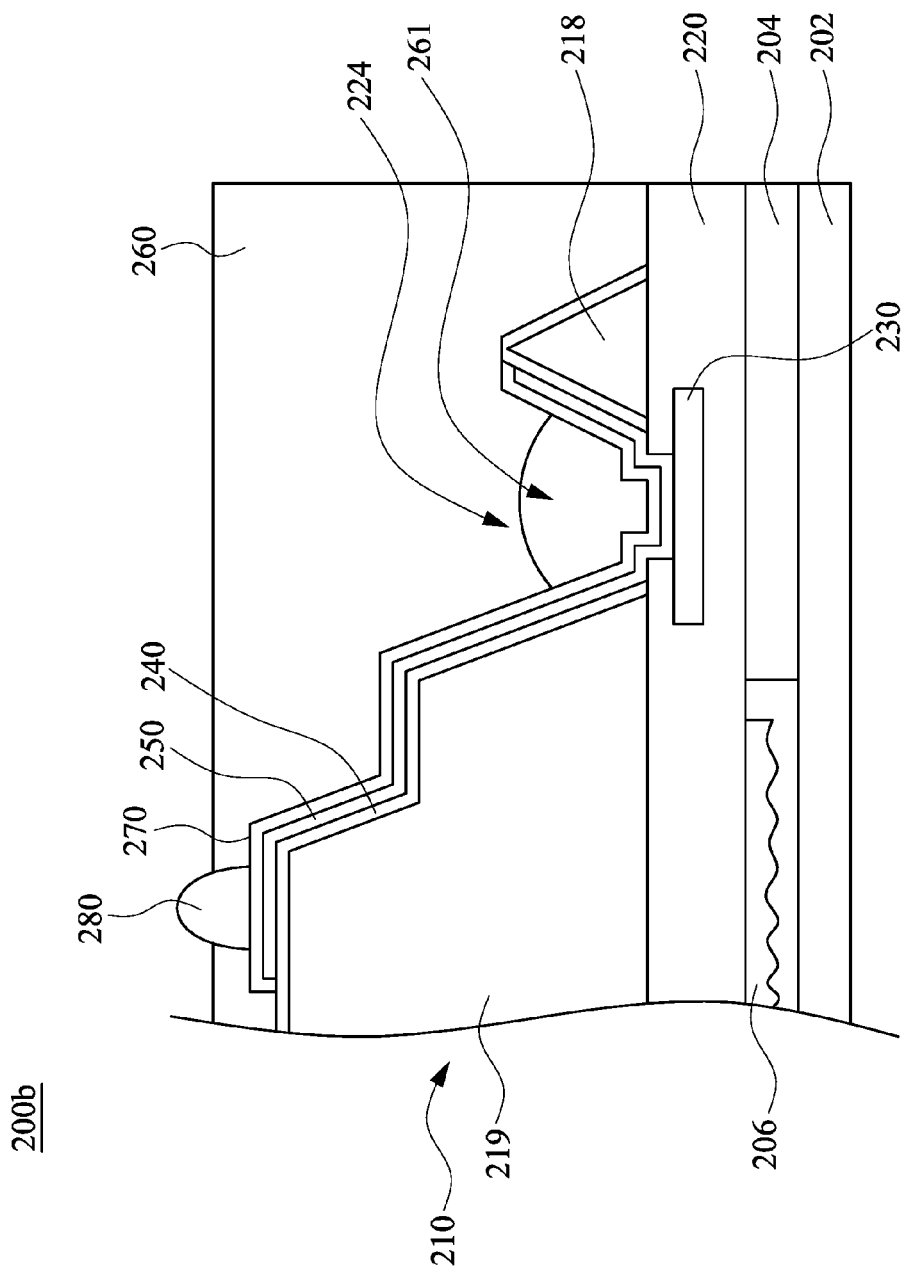
FIG. 13 is a cross-sectional view of a semiconductor structure according to one embodiment of the present invention.

FIG. 13 is a cross-sectional view of a semiconductor structure 200b according to one embodiment of the present invention. The semiconductor structure 200b includes the silicon substrate 210, the protection layer 220, the electrical pad 230, the isolation layer 240, the redistribution layer 250, the conductive layer 270, the passivation layer 260, and the conductive structure 280. The difference between this embodiment and the embodiment shown in FIG. 12 is that the semiconductor structure 200b further includes a void 261. The void 261 is among the passivation layer 206, the step structure 219, the tooth structure 218, and the electrical pad 230.

In the following description, the manufacturing method of the semiconductor structure 200a, 200b will be described.

Figure 14:
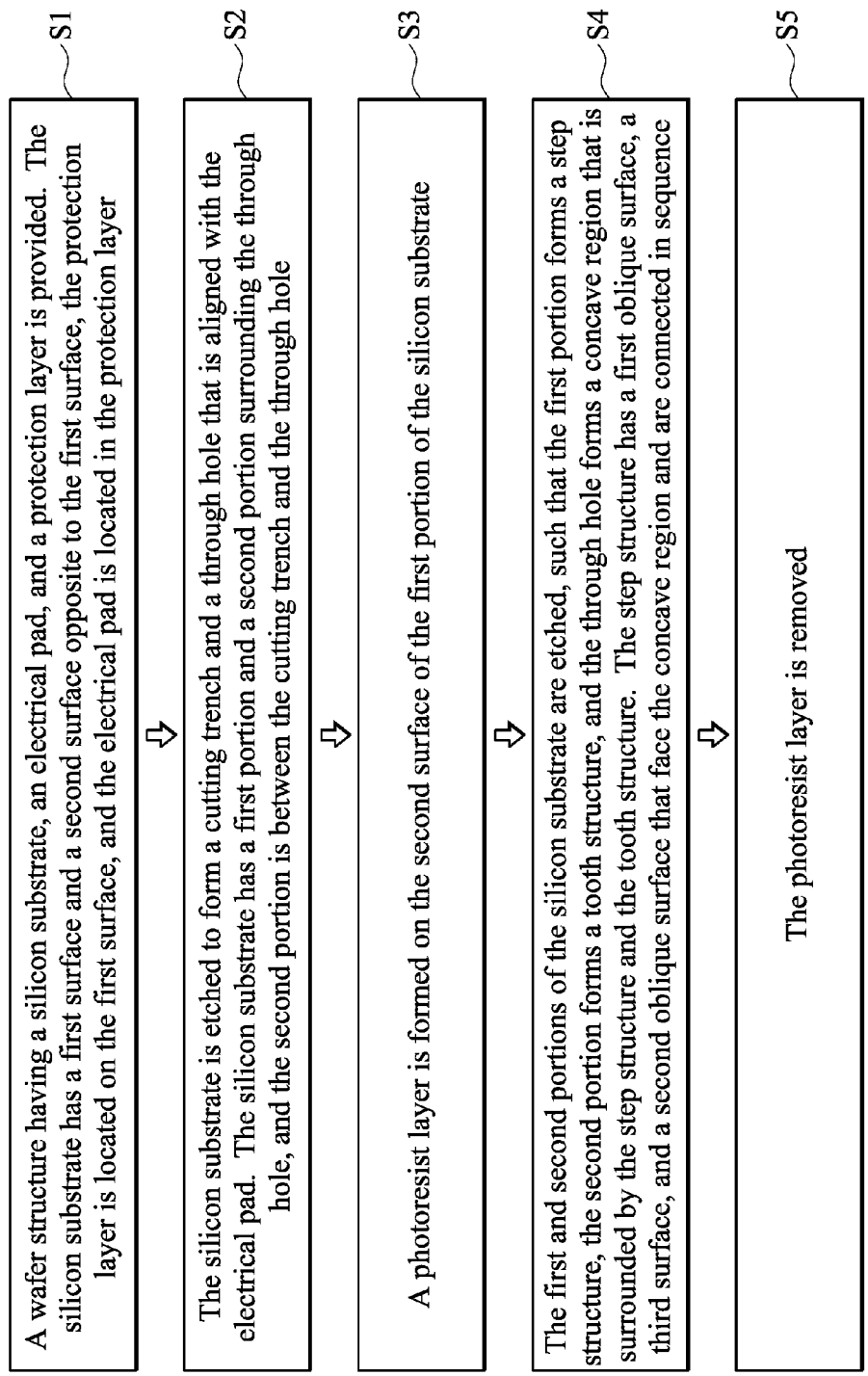
FIG. 14 is a flow chart of a manufacturing method of a semiconductor structure according to one embodiment of the present invention.

FIG. 14 is a flow chart of a manufacturing method of a semiconductor structure according to one embodiment of the present invention. In step S1, a wafer structure having a silicon substrate, an electrical pad, and a protection layer is provided. The silicon substrate has a first surface and a second surface opposite to the first surface, the protection layer is located on the first surface, and the electrical pad is located in the protection layer. Thereafter in step S2, the silicon substrate is etched to form a cutting trench and a through hole that is aligned with the electrical pad. The silicon substrate has a first portion and a second portion surrounding the through hole, and the second portion is between the cutting trench and the through hole. Next in step S3, a photoresist layer is formed on the second surface of the first portion of the silicon substrate. Thereafter in step S4, the first and second portions of the silicon substrate are etched, such that the first portion forms a step structure, the second portion forms a tooth structure, and the through hole forms a concave region that is surrounded by the step structure and the tooth structure. The step structure has a first oblique surface, a third surface, and a second oblique surface that face the concave region and are connected in sequence. Finally in step S5, the photoresist layer is removed.

In the following description, the respective steps of the aforementioned manufacturing method of the semiconductor structure will be described, and the silicon substrate 210a is used to represent a wafer which is not divided yet to form plural chips.

Figure 15:
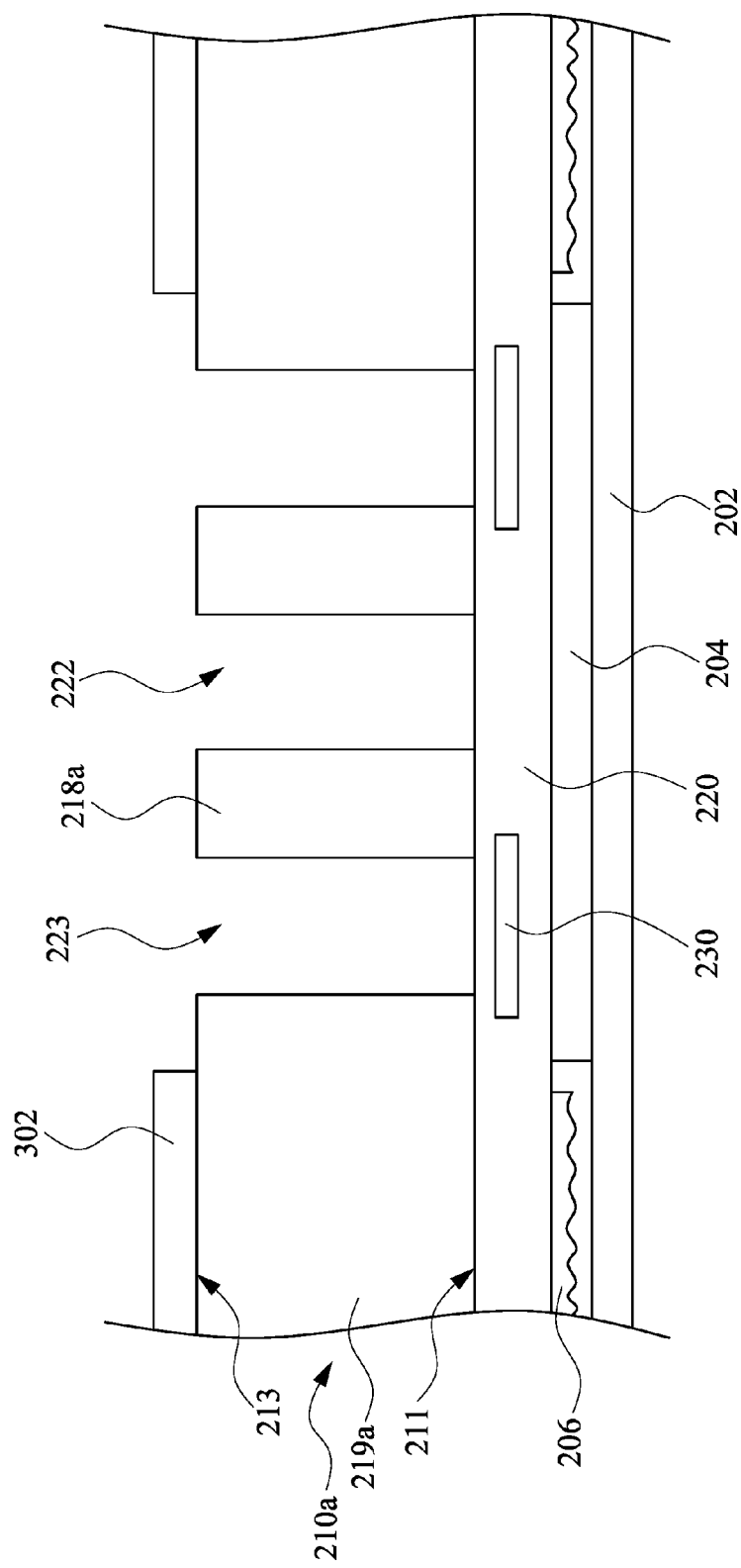
FIG. 15 is a cross-sectional view of a cutting trench and a through hole after being formed in a silicon substrate according to one embodiment of the present invention.

FIG. 15 is a cross-sectional view of the cutting trench 222 and the through hole 223 after being formed in the silicon substrate 210a according to one embodiment of the present invention. The wafer structure having the silicon substrate 210a, the electrical pad 230, and the protection layer 220 is provided. The silicon substrate 210a has the first surface 211 and the second surface 213 opposite to the first surface 211, the protection layer 220 is located on the first surface 211, and the electrical pad 230 is located in the protection layer 220. In this embodiment, the wafer structure further has the light transmissive element 202 and the supporting layer 204 that is between the light transmissive element 202 and the protection layer 220. Thereafter, the silicon substrate 210a may be etched to form the cutting trench 222 and the through hole 223 that is aligned with the electrical pad 230, such that the silicon substrate 210a has a first portion 219a and a second portion 218a that surround the through hole 223. The second portion 218a is between the cutting trench 222 and the through hole 223.

Figure 16:
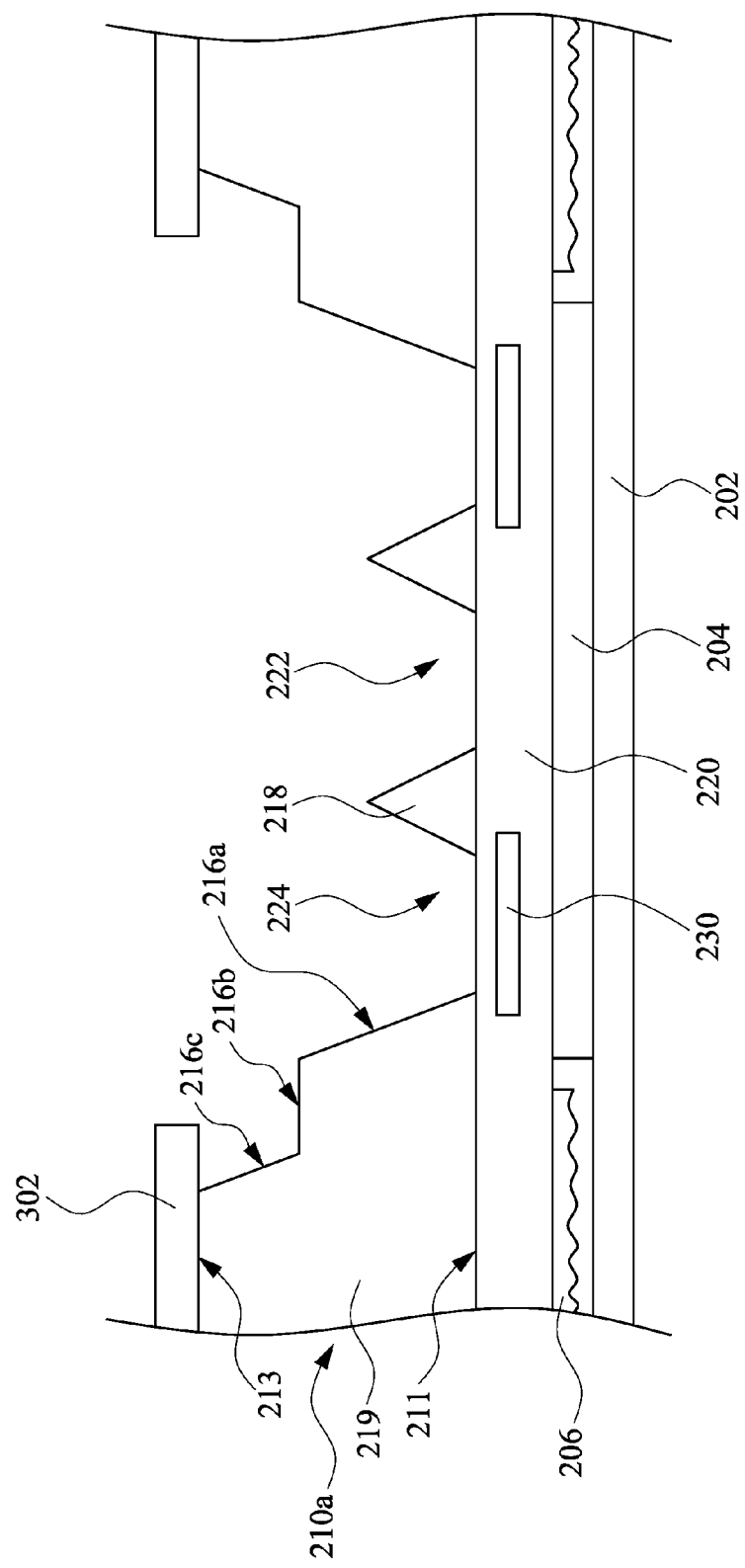
FIG. 16 is a cross-sectional view of a first portion and a second portion of the silicon substrate shown in FIG. 15 after being etched.

FIG. 16 is a cross-sectional view of the first portion 219a and the second portion 218a of the silicon substrate 210a shown in FIG. 15 after being etched. As shown in FIG. 15 and FIG. 16, after the cutting trench 222 and the through hole 223 are formed, a photoresist layer 302 may be formed on the second surface 213 of the first portion 219a of the silicon substrate 210a. Afterwards, the first and second portions 219a, 218a of the silicon substrate 210a may be etched. Since the first portion 219a of the silicon substrate 210a adjacent to the second surface 213 is protected by the photoresist layer 302, the step structure 219 is formed by the side etching for the first portion 219a. Furthermore, the second portion 218a forms the tooth structure 218. The through hole 223 forms the concave region 224 that is surrounded by the step structure 219 and the tooth structure 218. The step structure 219 has the first oblique surface 216a, the third surface 216b, and the second oblique surface 216c that face the concave region 224 and are connected in sequence.

Figure 17:
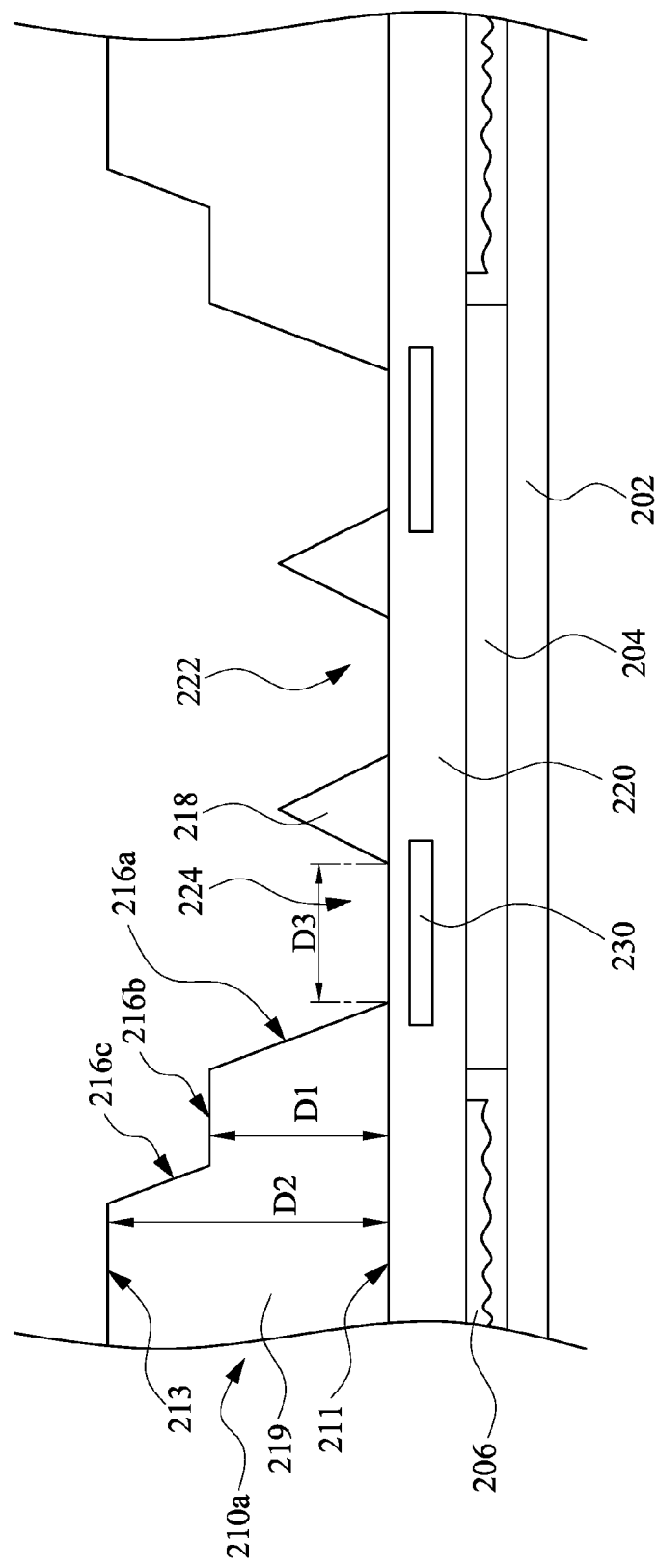
FIG. 17 is a cross-sectional view of a photoresist layer on a step structure shown in FIG. 16 after being removed.

FIG. 17 is a cross-sectional view of the photoresist layer 302 on the step structure 219 shown in FIG. 16 after being removed. As shown in FIG. 16 and FIG. 17, after the step structure 219 and the tooth structure 218 are formed, the photoresist layer 302 may be removed. In FIG. 17, the height of the step structure 219 is greater than the height of the tooth structure 218. The distance D1 between the first and third surfaces 211, 216b of the silicon substrate 210a is smaller than the distance D2 between the first and second surfaces 211, 213. That is to say, the height of the third surface 216b is lower than the height of the second surface 213, such that the via aspect ratio (depth/width) of the concave region 224 may be reduced from D2/D3 to D1/D3.

Figure 18:
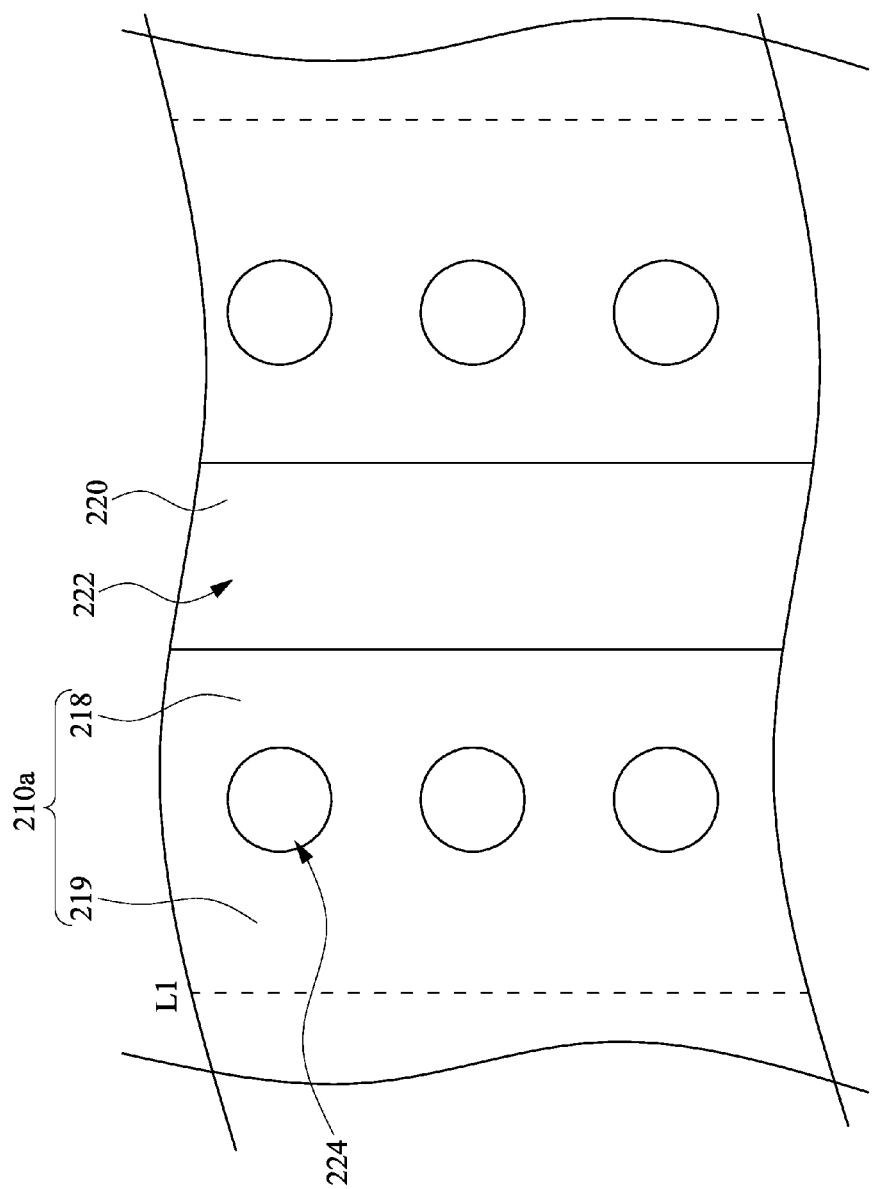
FIG. 18 is a top view of a concave region and the cutting trench shown in FIG. 17.

FIG. 18 is a top view of the concave region 224 and the cutting trench 222 shown in FIG. 17. As shown in FIG. 17 and FIG. 18, the tooth structure 218 is located at the right side of the concave region 224, and the step structure 219 is located at the left side of the concave region 224. The thickness of the silicon substrate 210a at the left side of line L1 is the distance D2 between the first and second surfaces 211, 213, and the thickness of the silicon substrate 210a at the right side of line L1 is the distance D1 between the first and third surfaces 211, 216b.

Figure 19:
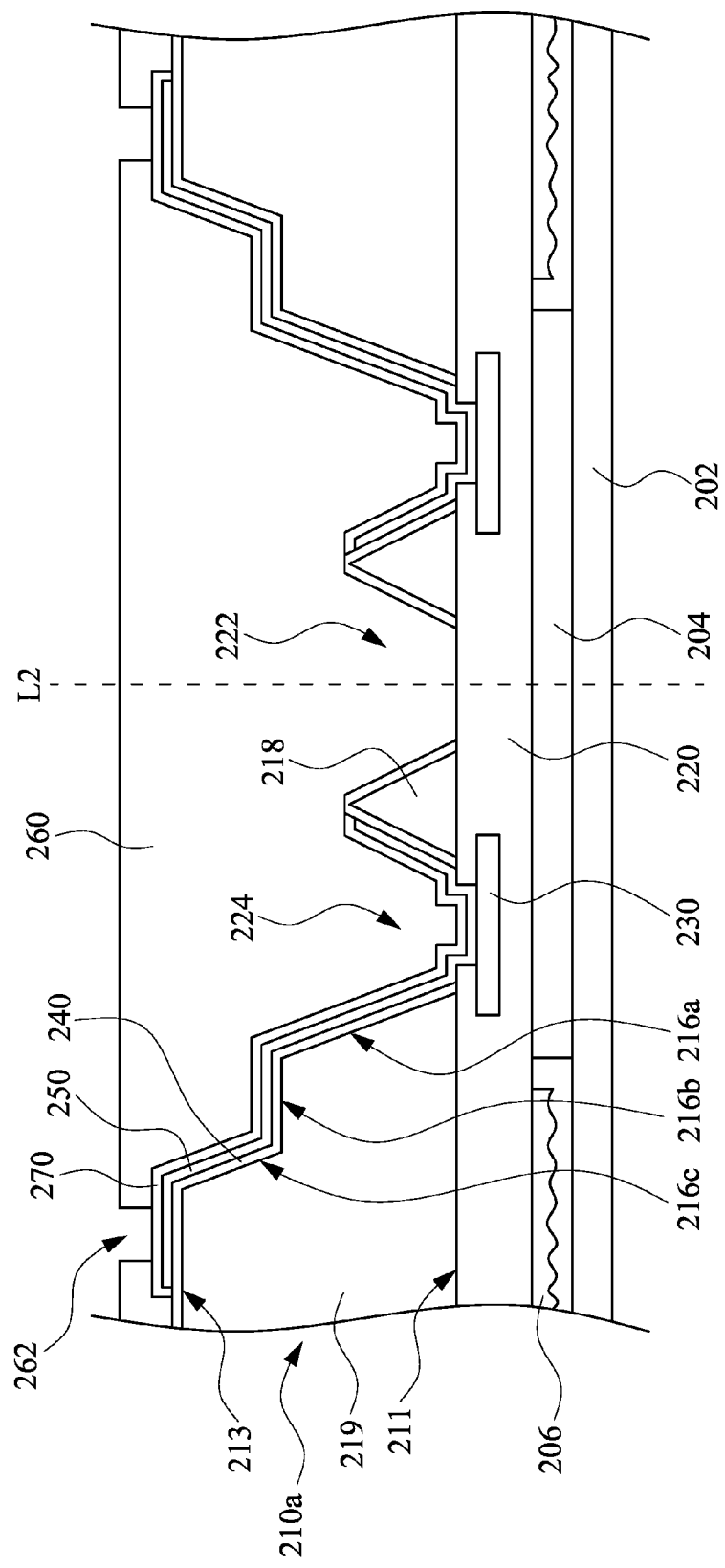
FIG. 19 is a cross-sectional view of an isolation layer, a redistribution layer, and a conductive layer after being formed on the silicon substrate shown in FIG. 17.

FIG. 19 is a cross-sectional view of the isolation layer 240, the redistribution layer 250, and the conductive layer 270 after being formed on the silicon substrate 210a shown in FIG. 17. As shown in FIG. 17 and FIG. 19, after the photoresist layer 302 (see FIG. 16) is removed, the isolation layer 240 may be formed on the tooth structure 218, the step structure 219, and the protection layer 220. Thereafter, the isolation layer 240 may be patterned, such that the electrical pad 230 is exposed through the concave region 224. The isolation layer 240 may be formed by chemical vapor deposition (CVD), but the present invention is not limited in this regard. Moreover, the patterning process may include an exposure process, a development process, and an etching process in photolithography technique.

After the patterned isolation layer 240 is formed, the redistribution layer 250 may be formed on the isolation layer 240 and the electrical pad 230. Afterwards, the conductive layer 270 may be formed on the redistribution layer 250. Since the redistribution layer 250 is made of metal (e.g., aluminum), the conductive layer 270 can be formed on the redistribution layer 250 by utilizing a chemical plating process. The conductive layer 270 may be made of a material including gold. When the conductive layer 270 is manufactured, the redistribution layer 250 may be immersed in nickel solution, and subsequently immersed in gold solution, such that the conductive layer 270 with nickel and gold can be formed on the redistribution layer 250.

After the conductive layer 270 is formed, the passivation layer 260 may be formed to cover the step structure 219 and the tooth structure 218. Thereafter, the passivation layer 260 is patterned, such that the passivation layer 260 on the second surface 213 of the step structure 219 has the opening 262. The conductive layer 270 is exposed through the opening 262.

As shown in FIG. 12 and FIG. 19, after the opening 262 of the passivation layer 260 is formed, the conductive structure 280 may be disposed on the conductive layer 270 in the opening 262, such that the conductive structure 280 is electrically connected to the electrical pad 230 through the redistribution layer 250 and the conductive layer 270. After the conductive structure 280 is disposed, the passivation layer 260, the protection layer 220, the supporting layer 204, and the light transmissive element 202 may be cut along the cutting trench 222 (i.e., line L2). As a result, the semiconductor structure 200a shown in FIG. 12 or the semiconductor structure 200b shown in FIG. 13 can be obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a semiconductor structure, the manufacturing method comprising:
   providing a wafer structure having a silicon substrate, an electrical pad, and a protection layer, wherein the silicon substrate has a first surface and a second surface opposite to the first surface, the protection layer is located on the first surface, and the electrical pad is located in the protection layer;
   etching the silicon substrate to form a cutting trench and a through hole that is aligned with the electrical pad, wherein the silicon substrate has a first portion and a second portion surrounding the through hole, and the second portion is between the cutting trench and the through hole;
   forming a photoresist layer on the second surface of the first portion of the silicon substrate;
   etching the first and second portions of the silicon substrate, such that the first portion forms a step structure, the second portion forms a tooth structure, and the through hole forms a concave region surrounded by the step structure and the tooth structure, wherein the step structure has a first oblique surface, a third surface, and a second oblique surface facing the concave region and connected in sequence; and
   removing the photoresist layer.

2. The manufacturing method of claim 1, further comprising:
   forming an isolation layer on the tooth structure, the step structure, and the protection layer; and
   patterning the isolation layer, such that the electrical pad is exposed through the concave region.

3. The manufacturing method of claim 2, further comprising:
   forming a redistribution layer on the isolation layer and the electrical pad.

4. The manufacturing method of claim 3, further comprising:
   forming a conductive layer on the redistribution layer.

5. The manufacturing method of claim 4, further comprising:
   forming a passivation layer to cover the step structure and the tooth structure; and patterning the passivation layer, such that the passivation layer on the second surface has an opening, wherein the conductive layer is exposed through the opening.

6. The manufacturing method of claim 5, further comprising:
disposing a conductive structure on the conductive layer in the opening of the passivation layer.

7. The manufacturing method of claim 2, wherein the isolation layer is formed on the tooth structure, the step structure, and the protection layer by utilizing a chemical vapor deposition process.

8. The manufacturing method of claim 4, wherein the conductive layer is formed on the redistribution layer by utilizing a chemical plating process.

9. The manufacturing method of claim 1, wherein the wafer structure has a light transmissive element and a supporting layer that is between the light transmissive element and the protection layer, and the manufacturing method further comprises:
cutting the passivation layer, the protection layer, the supporting layer, and the light transmissive element along the cutting trench.

\* \* \* \* \*